(12) United States Patent
Tesler

(10) Patent No.: US 7,904,265 B2
(45) Date of Patent: Mar. 8, 2011

(54) CIRCUITS AND METHODS FOR CALIBRATING A DELAY ELEMENT

(75) Inventor: Alexander Tesler, Palo Alto, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 275 days.

(21) Appl. No.: 12/052,403

(22) Filed: Mar. 20, 2008

(65) Prior Publication Data

US 2009/0240456 A1     Sep. 24, 2009

(51) Int. Cl.
*G01R 29/02*   (2006.01)
*G01R 19/00*   (2006.01)

(52) U.S. Cl. .................. 702/79; 702/64; 702/65; 702/72

(58) Field of Classification Search .............. 702/79–94, 702/64–72, 189
See application file for complete search history.

(56) References Cited

U.S. PATENT DOCUMENTS

| 7,062,733 B1 * | 6/2006 | Poskatcheev et al. ............ 716/6 |
| 7,210,074 B2 | 4/2007 | Mc Auliffe | |

* cited by examiner

*Primary Examiner* — Andrew Schechter
*Assistant Examiner* — Phuong Huynh

(57) ABSTRACT

A controllable delay element is coupled in parallel with a calibration circuit. The calibration circuit receives a periodic reference signal and generates a series of sample voltages responsive to a time-varying analog voltage, the periodic reference signal, and the delayed periodic signal at the output of the controllable delay element. The calibration circuit distributes the series of sampled voltages for determining the components of a first vector. The first vector components are used to calculate the phase that results from a control signal applied to the controllable delay element. After the control signal is modified, a second vector is used to calculate the phase that results from the control signal. The delay can be determined by the product of the period of the reference signal and the difference in phase.

19 Claims, 5 Drawing Sheets

$V_1$ = phase vector for first control signal $V_2$ = phase vector for second control signal $\psi_2 - \psi_1$ = the measured phase difference between the first and second control signals

CIRCUITS AND METHODS FOR CALIBRATING A DELAY ELEMENT

BACKGROUND

The fundamental operation of a test instrument is to capture the response of a device under test to a known stimulus. In general, test instruments have the capability of applying a precisely controlled electrical signal or stimulus to a desired circuit in a device under test. With the development of increasingly faster integrated circuits there is a corresponding increase in the demands made upon test instruments used for quality control or evaluation of the integrated circuits, subassemblies and completed devices in which the circuits are used.

Typically, test instruments require accurate calibration of a controllable delay element to generate a known stimulus. Some test instruments undergo a factory calibration procedure, during which the test instrument is the device under test. A stimulus is applied and the result of the stimulus is recorded using an oscilloscope or other suitable test equipment. Results, recorded during the calibration are applied to software, which translates the stimulus and result information to a function or table that describes operation of the controllable delay element and related circuit components. The function or table may account for changes in frequency, temperature or other factors that effect performance of the controllable delay element. The function or table is often stored in a memory with the test instrument.

Delay elements and related circuit components are known to vary in response due to manufacturing variation, operating frequency and temperature, among other factors. A factory calibration is somewhat limited in that temperature or aging instability of one or more components of the controllable delay element and related circuit components cannot be corrected. As a result, undesired inaccuracies may be unknowingly introduced by the controllable delay element.

U.S. Pat. No. 7,062,733 describes circuits and methods for delay line calibration. The methods compare sub-sampled signals to determine time delay, calibration of delay elements, and other precise time domain measurements based on properties of aliased signals produced by the sub-sampling. The time delay is determined and averaged over a measurement window and then scaled to determine an amount of delay in the delayed signal. While the circuits and methods for delay line calibration purport to remove the necessity of performing a factory calibration, the sub-sampling techniques are complex and sensitive to short term temperature stability, require stable controllable delay elements and accurate monitoring of system temperature.

Therefore, it would be desirable to provide a low cost, reliable and integrated delay element calibration solution that can perform across a range of devices and environmental conditions.

SUMMARY

An embodiment of a circuit for calibrating a delay element includes a controllable delay element configured to receive a periodic reference signal at a first input and a control signal at a second input. The controllable delay element generates a delayed periodic signal responsive to the periodic reference signal and the control signal at an output. A calibration circuit is coupled in parallel with the controllable delay element. The calibration circuit receives the periodic reference signal and an analog voltage and generates a series of sample voltages responsive to the delayed periodic signal, the periodic reference signal and the analog voltage. The series of sampled voltages provide magnitudes that are used to generate a measure of phase responsive to the control signal.

An embodiment of a method for determining the delay of a delay element comprises the steps of applying a reference signal to a delay element and a divider, the divider generating a first modified reference signal, providing a first delay control signal at a control input of the delay element to generate a delayed signal responsive to the reference signal, comparing the modified reference signal with a time-varying voltage to generate a sample voltage, distributing a series of voltages equally separated in phase and responsive to the sample voltage to one of an integer number of outputs in accordance with the delayed signal, using the series of voltages equally separated in phase to calculate components of a first vector, determining a first phase from the first vector responsive to the first control input, adjusting the control input of the delay element and repeating the comparing, distributing, and using to calculate the components of a second vector, determining a second phase from the second vector responsive to the second control input and calculating the delay from the first phase and the second phase.

The figures and detailed description that follow are not exhaustive. The disclosed embodiments are illustrated and described to enable one of ordinary skill to make and use the circuits and methods for determining the delay of a delay element. Other embodiments, features and advantages of the circuits and methods will be or will become apparent to those skilled in the art upon examination of the following figures and detailed description. All such additional embodiments, features and advantages are within the scope of the assemblies and methods as defined in the accompanying claims.

BRIEF DESCRIPTION OF THE FIGURES

The circuits and methods for determining the delay of a delay element can be better understood with reference to the following figures. The components within the figures are not necessarily to scale, emphasis instead being placed upon clearly illustrating the principles of determining a present delay of a delay element. Moreover, in the figures, like reference numerals designate corresponding parts throughout the different views.

DETAILED DESCRIPTION

Figure 1:
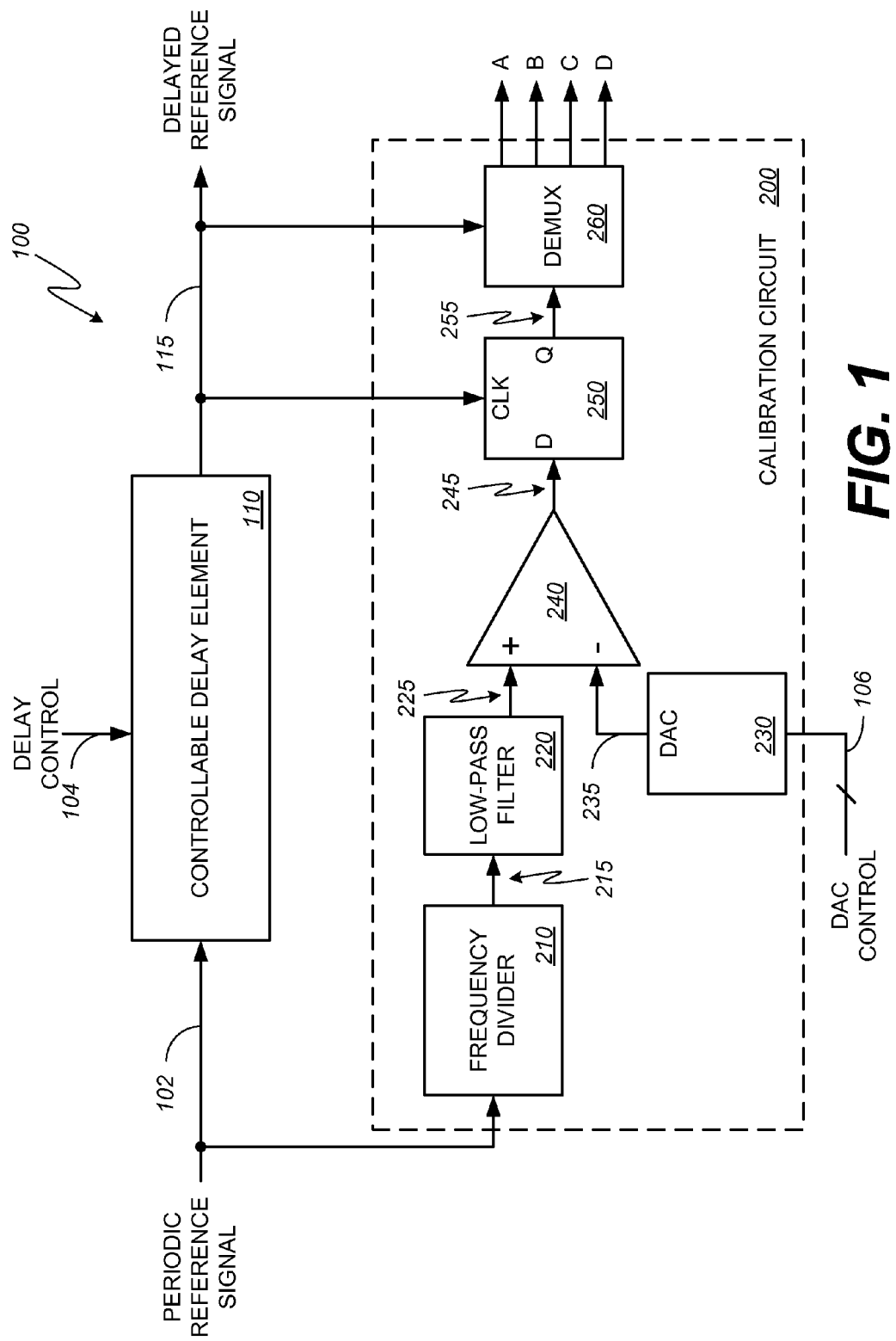
FIG. 1 is a simplified circuit diagram of an embodiment of a circuit including a controllable delay element and a calibration circuit.

Although described with particular reference to a test instrument, the circuits, systems and methods for determining the delay of a controllable delay element can be implemented in any system where it is desirable to determine the relative delay caused by the application of select input signals at the control input of the controllable delay element.

A delay circuit includes a calibration circuit arranged in parallel with a controllable delay element. The delay circuit receives a periodic reference signal (e.g., a clock signal) at a first input and generates a delayed reference signal in accordance with a control signal applied to a control input of the delay element. The arrangement of the calibration circuit in parallel with the controllable delay element resolves the problems of aging, temperature and frequency instability common with factory calibrated delay elements.

The calibration circuit includes a divider, a comparator, a flip-flop and a demultiplexer. The calibration circuit modifies the periodic reference signal and generates a series of sampled voltages that are separated equally in phase from one another. The sampled voltages track the shape of the periodic reference signal. The magnitudes of the sampled voltages are mathematically combined to compute the components of a first polar vector. A first phase measurement responsive to the control signal at the input to the controllable delay element is determined from the first polar vector. Thereafter, the control signal at the control input to the controllable delay element is adjusted. In turn, the calibration circuit continues to operate in parallel with the controllable delay element as described above. The calibration circuit generates a modified series of sampled voltages. The magnitudes of the modified series of sampled voltages are mathematically combined to compute the components of a second polar vector. A second phase measurement responsive to the adjusted control signal at the input to the controllable delay element is determined from the second polar vector. Once the first and second polar vectors and phase measurements have been accomplished, the difference between the first and second phase measurements when multiplied by the period of the reference signal produces the duration of the delay step.

The above-described components of the calibration circuit are circuit elements that operate under the control of a delay control signal and a digital word. When integrated in a test instrument, the calibration circuit may be operated under the control of software or various combinations of software and hardware. When implemented in hardware, a processor within the test instrument can be implemented on a single integrated circuit (e.g., an application specific integrated circuit) or using separate hardware elements and logic. Calibration software can be executed to control the application of a desired analog voltage at the control input of the delay element as well as the digital word at the input to the DAC. The calibration software includes logic for determining the components of a polar vector and determining a phase from the polar vector. The calibration software further includes logic for determining the incremental change in phase and the delay step. The software can be stored in a memory and executed by a suitable instruction execution system (e.g., a processor or a microprocessor). A hardware implementation of the processor can include any or a combination of the following technologies, which are all well known in the art: discrete electronic components, discrete logic circuit(s) having logic gates for implementing logic functions upon data signals, an application specific integrated circuit having appropriate logic gates, a programmable gate array(s) (PGA), a field programmable gate array (FPGA), etc.

The calibration software comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

Turning now to the drawings, wherein like reference numerals designate corresponding parts throughout the drawings, reference is made to FIG. 1, which illustrates a simplified circuit diagram of an embodiment of a circuit 100 including a controllable delay element 110 and a calibration circuit 200. The controllable delay element 110 receives a periodic reference signal along connection 102 at a first input and generates a delayed reference signal at an output coupled to connection 115. The delay between the periodic reference signal and the delayed reference signal is in accordance with an analog voltage provided at a control input on connection 104. An example controllable delay element or Analog Phase Shifter (model number HMC247) is available from Hittite Microwave Corporation of Chelmsford, Mass., U.S.A.

The calibration circuit 200 is arranged in parallel with the controllable delay element 110. That is, the calibration circuit receives the periodic reference signal (e.g., a clock signal) via connection 102 and the delayed reference signal via connection 115. The calibration circuit 200 also receives a DAC control signal (i.e., a digital word) via connection 106. The calibration circuit 200 generates four outputs labeled A through D. The calibration circuit 200 includes a series combination of a frequency divider 210, a comparator 240, a D flip-flop 250, and a demultiplexer 260. In the illustrated embodiment, a low-pass filter is inserted between the frequency divider 210 and a positive input of the comparator 240. The frequency divider is coupled to the low-pass filter via connection 215. The low-pass filter 240 is coupled to the comparator via connection 225. The output of the comparator 240 is coupled to the D-input of the flip-flop 250 via connection 245. The clock input of the D flip-flop 250 is coupled to the output of the controllable delay element 110 via connection 115. The Q output of the D flip-flop 250 is coupled to the demultiplexer 260 via connection 255. The reference or negative input of the comparator 240 is coupled to DAC 230 via connection 235.

In operation, the frequency divider 210 receives the periodic reference signal and produces a modified reference signal on connection 215 having a frequency that is 1/N*the frequency of the periodic reference signal received on connection 102. Where N is an integer value that describes the architecture an operation of the frequency divider 210. A divide by 2 frequency divider generates an output with a frequency that is ½ the frequency of the input signal. A divide by 4 frequency divider generates an output with a frequency that is ¼ the frequency of the input signal. In the present embodiment, a divide by 4 frequency divider is used. An example divide by 4 frequency divider or Divide by 4 Prescaler (model number 25675DV) is available from Inphi Corporation of Westlake Village, Calif., U.S.A. The low-pass filter 220 receives the modified reference signal on connection 215 and reduces frequency components in the modified reference signal above a cut-off frequency of the filter. In the illustrated embodiment, the cut-off frequency is higher than ¼ the frequency of the reference signal on connection 102. The phase of the signal on connection 225, which is coupled to the positive input of the comparator 240, is relatively stable in comparison with the phase of the periodic reference signal on connection 102. The reference input or negative input of the comparator 240 receives a time-varying voltage signal. In the illustrated embodiment, the time-varying voltage is generated by the DAC 230 in accordance with a series of digital words on the input bus of the DAC. The voltage at the output of comparator 240 tracks the shape of the periodic reference signal on connection 102. The voltage at the output of the comparator 240 is sampled at the D-input of the flip-flop 150 in accordance with the delayed reference signal on connection 115.

When N is 4, a voltage is sampled 4 times per each period of the signal at the positive input of the comparator 240. Accordingly, each subsequent sample follows the previous sample by 90°, because the frequency of the delayed reference signal (i.e., the signal at the output of the controllable delay element) is 4× the frequency of the divided reference signal (i.e., the signal at the positive input of the comparator). The demultiplexer 260, which is coupled to the output of the D flip-flop 250, distributes the sampled voltages across the four outputs A-D.

Figure 2:
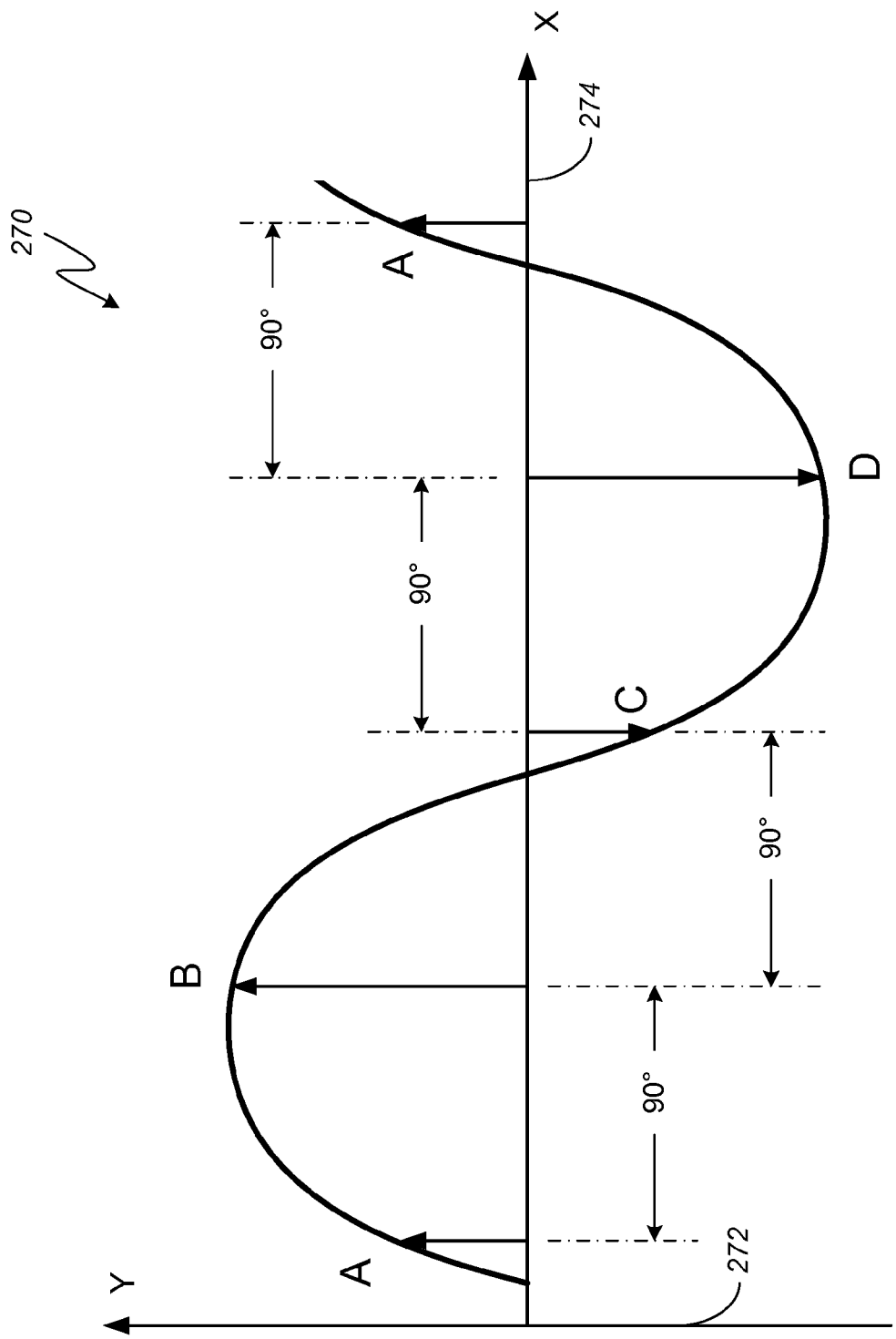
FIG. 2 is a plot of distributed sample magnitudes generated by the calibration circuit of FIG. 1.

FIG. 2 is a plot 270 of distributed sample magnitudes generated by the calibration circuit 200 of FIG. 1. The plot 270 shows voltage along a Y-axis 272 and time along a X-axis 274. The trace 280 is representative of the time-varying signal on connection 225 at the positive input to the comparator 240. The combination of the comparator 240 and the D flip-flop 250 sample the time-varying signal 4 times per period. Each of the sampled voltages A-D are scalar amounts applied on the corresponding labeled output of the demultiplexer 260 (FIG. 1). As illustrated in FIG. 2, each of the sampled voltages is 90° apart from its nearest neighboring sample points.

The four amplitudes associated with respective samples A-D can be used to calculate X-Y coordinates or components of a phase vector. For example, $X_1$, the X component of the phase vector $V_1$ can be determined from the difference of A and C. That is, $X_1 = A - C$. $Y_1$, the Y component of the phase vector $V_2$ can be determined from the difference of B and D. That is, $Y_1 = B - D$. The phase angle $\psi_1$ can be calculated using the standard function A TAN 2 as follows:

$$\Psi_1 = A\ TAN\ 2(Y, X) \quad\quad\quad Eq.\ 1$$

The A TAN 2 function is a standard function for computing the arctangent of a scalar ratio. The A TAN 2 function is available in C, C++, Java, PHP, C#, Fortran, MATLAB and many other programming languages and software applications.

When the analog voltage at the control input to the controllable delay element 110 (FIG. 1) changes, the delayed reference signal on the connection 115 changes by a corresponding incremental delay or delay step. The calibration circuit 200 samples the voltages at the output of the comparator 240 and distributes the sampled voltages on outputs A-D as described above. The incremental delay in the delayed reference signal shifts the location of the samples in the plot 270, such that $X_2$ and $Y_2$ identify a second phase vector $V_2$ different from the first phase vector $V_1$.

Figure 3:
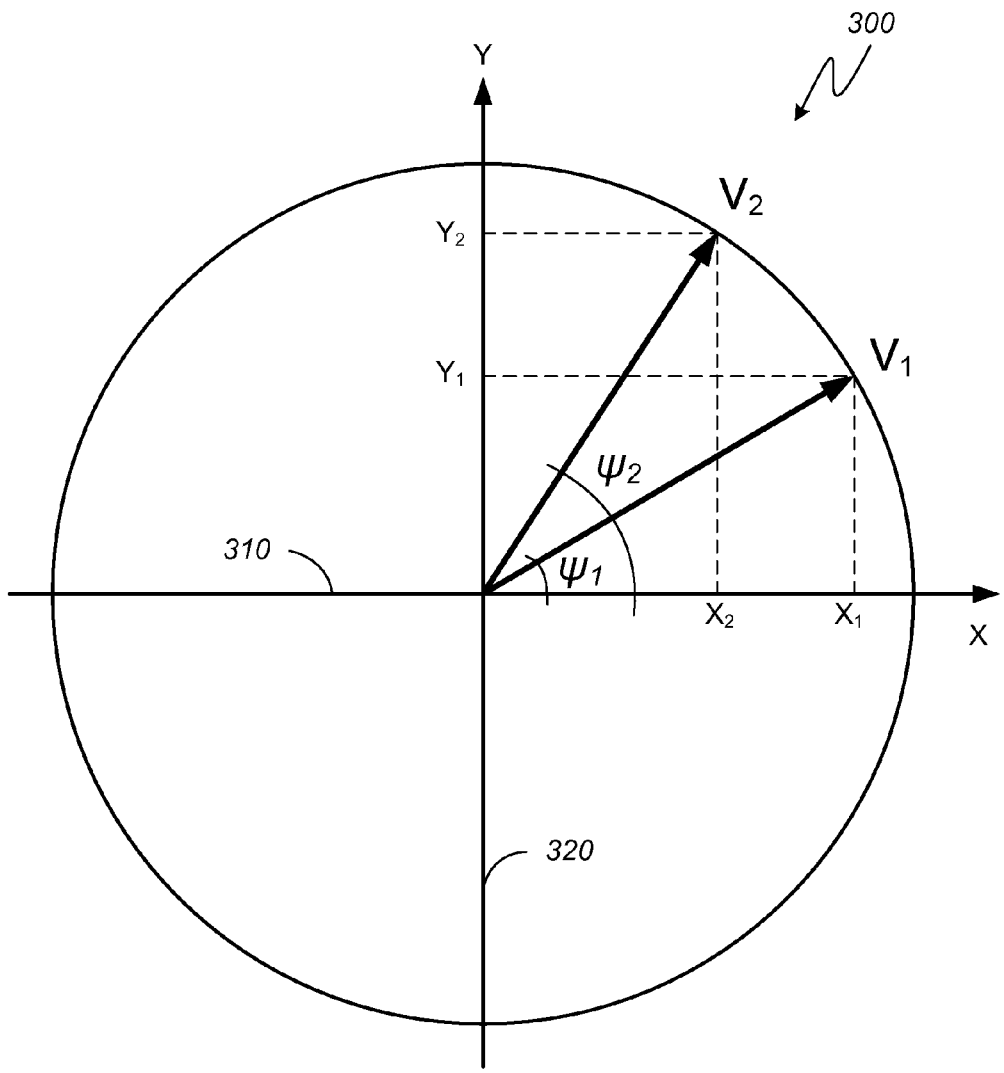
FIG. 3 is a schematic diagram illustrating the change in phase from an initial control signal to a second control signal applied to the controllable delay element of FIG. 1.

FIG. 3 a schematic diagram illustrating the change in phase from an initial control signal to a second control signal applied to the controllable delay element 110 of FIG. 1. The plot 300 includes a X-axis 310 and a Y-axis 320. A first vector $V_1$ includes component scalar magnitudes $X_1$ and $Y_1$. The first vector $V_1$ is further defined by phase angle $\psi_1$. As described above, the phase angle $\psi_1$ is a measure of the delay corresponding to a first control voltage at the control input to the controllable delay element 110 (FIG. 1). A second vector $V_2$ includes component scalar magnitudes $X_2$ and $Y_2$. The second vector $V_2$ is further defined by phase angle $\psi_2$. As described above, the phase angle $\psi_2$ is a measure of the delay corresponding to a second control voltage at the control input to the controllable delay element 110 (FIG. 1). As further illustrated in FIG. 3, the difference between the second phase angle and the first phase angle represents the incremental phase that results from the change in voltage at the control input of the controllable delay element 110.

Figure 4:
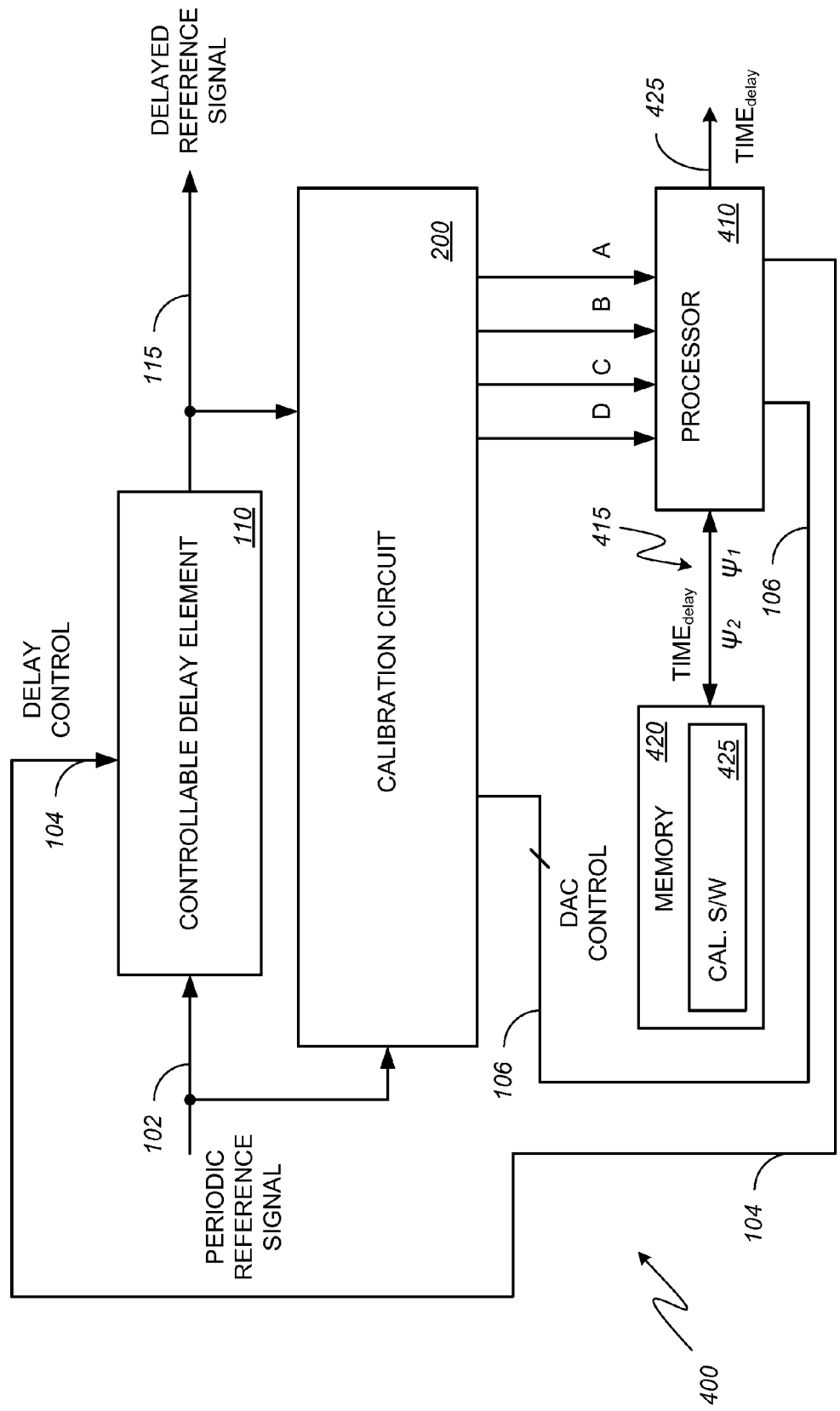
FIG. 4 is a functional block diagram of an embodiment of a system that includes the circuit of FIG. 1.

FIG. 4 is a functional block diagram illustrating an embodiment of a system 400 that includes the circuit 100 of FIG. 1. The system 400 includes a processor 410 and a memory 420 along with the circuit 100 introduced and described in association with FIG. 1. The processor 410 is coupled to the memory 420 via a bus 415. In the illustrated embodiment, the processor provides an analog voltage along connection 104 to the control input of the controllable delay element 110 and a DAC control or digital word via connection 106. It should be understood that voltages applied at the control input and the reference input of the comparator 240 (FIG. 1) may be provided by other circuits or elements separate from but under the control of the processor 410.

The processor 410 is a hardware device for executing instructions, such as those in calibration software 425 stored in memory 420 and manipulating data received via data inputs A-D or bus 415. As described above, the processor 410 determines vector components, phase angles, and an incremental time delay one or more of which may be stored in memory 420 or forwarded via connection 425 to one or more external destinations.

Storage devices suitable for tangibly embodying the calibration software in a test instrument include all forms of non-volatile memory, including, for example, semiconductor memory devices, such as EPROM, EEPROM, and flash memory devices. Storage devices for tangibly embodying the data and results including the above described sampled voltages, vector components, phase angles and delay increment labeled $TIME_{delay}$ in FIG. 4 include all forms of volatile memory, including, for example, semiconductor memory devices, such as random access memory (RAM) device and dynamic RAM (DRAM) devices.

The processor 410 is not limited to any particular hardware or firmware. The processor 410 may be implemented in any computing or data processing environment, including in digital electronic circuitry (e.g., an application-specific integrated circuit, such as a digital signal processor (DSP)) or in computer hardware, firmware, or software.

When implemented in hardware, the processor 410 can be implemented in any or a combination of the following technologies, which are all well known in the art: discrete electronic components, discrete logic circuit(s) having logic gates for implementing logic functions upon data signals, an application specific integrated circuit having appropriate logic gates, a programmable gate array(s) (PGA), a field programmable gate array (FPGA), etc.

Figure 5:
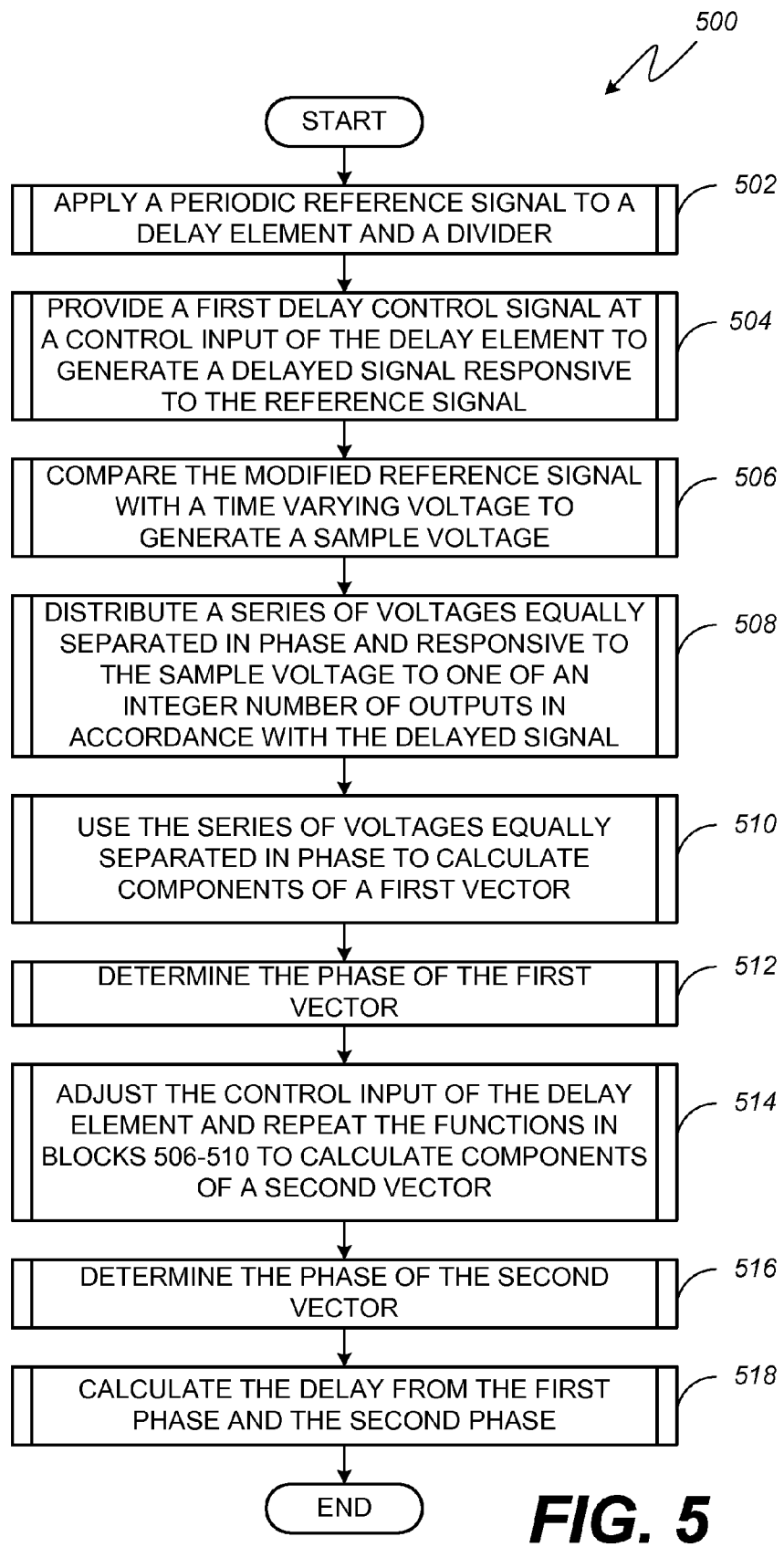
FIG. 5 is a flow chart illustrating an embodiment of a method for determining a delay step of the controllable delay element of FIG. 1.

FIG. 5 is a flow diagram illustrating an embodiment of a method for determining a delay step of the controllable delay element 110 of FIG. 1. The flow diagram of FIG. 5 shows the architecture, functionality, and operation of a possible implementation via software and circuit elements. In this regard, each block represents a module, segment, or portion of code, which comprises one or more executable instructions for implementing the specified function(s). When a function is implemented via hardware, one or more blocks in the flow diagram may represent a circuit or circuits.

Method 500 begins with block 502 where a periodic reference signal (e.g., a clock signal) is applied to a delay element and a divider. The divider generates a modified reference signal. In block 504, a first delay control signal (e.g., an analog voltage) is applied at a control input of the delay element to generate a delayed reference signal. In block 506, the modified reference signal is compared with a time-varying voltage to generate a sample voltage. Thereafter, as indicated in block 508, a series of sampled voltages equally separated in phase and responsive to the sample voltage are distributed to an integer number of outputs in accordance with the delayed reference signal. In block 510, the series of sampled voltages are used to calculate components of a first vector. Thereafter, the phase of the first vector is determined.

Having determined a first measure of the delay responsive to the first control signal, the calibration continues with block 514 where the control input is adjusted and the functions of blocks 506-510 are repeated to calculate the components of a second vector. Thereafter, in block 516, the phase of the second vector is determined. Last, the delay step introduced by the controllable delay element 110 is calculated from the first phase and the second phase, as shown in block 518. As described above, the product of the period of the reference signal and the difference of the first and second phase measurements results in the duration of the delay step.

While various embodiments of the circuits and methods for determining a present delay of a delay element have been described, it will be apparent to those of ordinary skill in the art that many more embodiments and implementations are possible that are within the scope of this disclosure. Accordingly, the described circuits, systems and methods for determining the delay of a delay element are not to be restricted or otherwise limited except in light of the attached claims and their equivalents.

What is claimed is:

1. A method for determining the delay of a delay element, the method comprising:
    applying a reference signal to a delay element and a divider, the divider generating a first modified reference signal;
    providing a first delay control signal at a control input of the delay element to generate a delayed signal responsive to the reference signal;
    comparing the modified reference signal with a time-varying voltage to generate a sample voltage;
    distributing a series of voltages equally separated in phase and responsive to the sample voltage to one of an integer number of outputs in accordance with the delayed signal;
    using the series of voltages equally separated in phase to calculate components of a first phase vector;
    determining a first phase measure from the first phase vector responsive to the first control input;
    adjusting the control input of the delay element and repeating the comparing, distributing, and using to calculate components of a second phase vector;
    determining a second phase measure from the second phase vector responsive to the second control input; and
    calculating the delay from the first phase measure and the second phase measure.

2. The method of claim 1, wherein applying a reference signal to the delay element and the divider comprises using a prescaler.

3. The method of claim 2, wherein using a prescaler comprises dividing the period of the reference signal into four sub-periods.

4. The method of claim 1, wherein generating a sample voltage comprises using a comparator.

5. The method of claim 1, further comprising applying the first modified reference signal to a low-pass filter.

6. The method of claim 1, wherein comparing the modified reference signal with a voltage to generate a second modified reference signal comprises coupling a digital-to-analog converter to a reference input of a comparator.

7. The method of claim 6, wherein distributing the sample voltage between an integer number of outputs for each period of the reference signal comprises inserting a series combination of a flip-flop and a demultiplexer at an output of the comparator.

8. The method of claim 1, wherein using the sample voltage of the integer number of outputs to calculate the magnitude of components of a first phase vector comprises determining a difference in magnitude of a first pair of sample voltages from the integer number of outputs.

9. The method of claim 8, wherein using the sample voltage of the integer number of outputs to calculate the magnitude of components of a first phase vector comprises determining a difference in magnitude of a second pair of sample voltages from the integer number of outputs.

10. The method of claim 9, wherein determining a measure of phase from the first phase vector responsive to the first control input comprises solving a trigonometric function by applying the magnitude of components of the first phase vector to the trigonometric function.

11. The method of claim 1, wherein calculating a delay comprises multiplying the period of the reference signal by the difference of the measure of phase from the second phase vector and the measure of phase from the first phase vector.

12. The method of claim 1, wherein delay of the delay element is determined while the delay element is in use.

13. A circuit for calibrating a delay element, comprising:
    a controllable delay element configured to receive a periodic reference signal at a first input and a control input at a second input, the controllable delay element further configured to generate a delayed periodic signal at an output;
    a calibration circuit coupled in parallel with the controllable delay element, the calibration circuit comprising a series combination of a prescaler, a comparator, a flip-flop and a demultiplexer, the demultiplexer coupled to the output of the controllable delay element via a clock input, the calibration circuit configured to receive the periodic reference signal, generate a scaled representation of the periodic reference signal and generate a series of sample voltages responsive to the delayed periodic signal, the scaled representation of the periodic reference signal and an analog voltage, the series of sample voltages providing magnitudes that are used to generate a measure of phase.

14. The circuit of claim 13, wherein the demultiplexer comprises a data input configured to receive the series of sample voltages.

15. The circuit of claim 14, wherein the demultiplexer distributes the sample voltages separated in time by a constant separation interval.

16. The circuit of claim 15, wherein the constant separation interval is ¼ the period of the periodic reference signal.

17. The circuit of claim 15, further comprising an arithmetic logic unit configured to receive the sample voltages from the demultiplexer and generate first and second amplitude components of a phase vector.

18. The circuit of claim 17, wherein the arithmetic logic unit calculates a measure of phase from the first and second amplitude components of the phase vector.

19. The circuit of claim 13, further comprising a low-pass filter inserted between the prescaler and the comparator.

* * * * *